(12) United States Patent
Tedrow et al.

(10) Patent No.: US 7,551,489 B2
(45) Date of Patent: Jun. 23, 2009

(54) MULTI-LEVEL MEMORY CELL SENSING

(75) Inventors: Kerry D. Tedrow, Folsom, CA (US);
Dung Nguyen, Folsom, CA (US); Bo Li, Folsom, CA (US); Rezaul Haque, Folsom, CA (US); Ahsanur Rahman, Rancho Cordova, CA (US); Saad P. Monasa, Sacramento, CA (US); Matthew Goldman, Terre Haute, IN (US)

(73) Assignee: Intel Corporation, Santa Clara, CA (US)

( * ) Notice: Subject to any disclaimer, the term of this patent is extended or adjusted under 35 U.S.C. 154(b) by 151 days.

(21) Appl. No.: 11/320,529

(22) Filed: Dec. 28, 2005

(65) Prior Publication Data

US 2007/0171708 A1    Jul. 26, 2007

(51) Int. Cl.
G11C 16/06 (2006.01)
(52) U.S. Cl. ............... 365/185.23; 365/185.03; 365/185.21
(58) Field of Classification Search ............ 365/185.03, 365/185.17, 185.28, 185.21, 185.23, 85.03, 365/185.171
See application file for complete search history.

(56) References Cited

U.S. PATENT DOCUMENTS

| | | | |
|---|---|---|---|
| 5,172,338 A | 12/1992 | Mehrotra et al. | |
| 5,508,958 A | 4/1996 | Fazio | |
| 5,608,669 A | 3/1997 | Mi et al. | |
| 5,748,534 A * | 5/1998 | Dunlap et al. | 365/185.21 |
| 5,768,188 A | 6/1998 | Park | |
| 5,892,727 A | 4/1999 | Nakagawa | |
| 5,946,258 A | 8/1999 | Evertt et al. | |
| 5,953,256 A | 9/1999 | Briner | |
| 6,009,040 A | 12/1999 | Choi et al. | |
| 6,014,330 A | 1/2000 | Endoh et al. | |
| 6,118,701 A | 9/2000 | Uekubo | |
| 6,181,599 B1 * | 1/2001 | Gongwer | 365/185.18 |
| 6,255,900 B1 * | 7/2001 | Chang et al. | 327/589 |
| 6,259,627 B1 * | 7/2001 | Wong | 365/185.21 |
| 6,333,885 B1 | 12/2001 | Bedarida et al. | |
| 6,396,739 B2 | 5/2002 | Briner | |
| 6,462,988 B1 * | 10/2002 | Harari | 365/185.22 |
| 6,559,710 B2 | 5/2003 | Matsuoka | |
| 6,586,985 B1 | 7/2003 | Romas, Jr. et al. | |
| 6,603,702 B2 * | 8/2003 | Kojima | 365/230.06 |
| 6,697,282 B1 | 2/2004 | Keeney et al. | |

(Continued)

FOREIGN PATENT DOCUMENTS

EP    1071094    1/2001

(Continued)

OTHER PUBLICATIONS

*International Search Report and Written opinion for application No. PCT/US2006/048043*, (Aug. 22, 2007),20 pgs.

Primary Examiner—VanThu Nguyen
Assistant Examiner—Han Yang
(74) Attorney, Agent, or Firm—Dana B. Lemoine; Lemoine Patent Services, PLLC

(57) ABSTRACT

A multi-level cell memory device performs a read by providing a stepped voltage waveform on a wordline, and comparing cell currents to a substantially constant reference current. Prior to the application of the stepped voltage waveform, the wordline may share charge with another circuit node.

7 Claims, 10 Drawing Sheets

U.S. PATENT DOCUMENTS

| | | | |
|---|---|---|---|
| 6,731,540 B2 * | 5/2004 | Lee et al. | 365/185.17 |
| 6,798,278 B2 | 9/2004 | Ueda | |
| 6,806,762 B2 | 10/2004 | Stair et al. | |
| 6,870,766 B2 * | 3/2005 | Cho et al. | 365/185.03 |
| 6,970,037 B2 | 11/2005 | Sakhuja et al. | |
| 7,054,197 B2 | 5/2006 | Vimercati | |
| 7,092,295 B2 * | 8/2006 | Iwase et al. | 365/185.28 |
| 7,106,626 B2 * | 9/2006 | Goldman et al. | 365/185.03 |
| 7,116,597 B1 | 10/2006 | Goldman et al. | |
| 7,176,751 B2 | 2/2007 | Giduturi et al. | |
| 2002/0053944 A1 | 5/2002 | Brass et al. | |
| 2002/0105835 A1 | 8/2002 | Pasotti et al. | |
| 2003/0002334 A1 | 1/2003 | Chang | |
| 2003/0021152 A1 * | 1/2003 | Le et al. | 365/185.18 |
| 2004/0136237 A1 * | 7/2004 | Banks | 365/185.03 |
| 2005/0018488 A1 * | 1/2005 | Kim et al. | 365/185.28 |
| 2005/0265073 A1 * | 12/2005 | Chae et al. | 365/185.03 |
| 2007/0076473 A1 | 4/2007 | Giduturi | |

FOREIGN PATENT DOCUMENTS

| | | |
|---|---|---|
| EP | 1071094 A1 | 1/2001 |
| EP | 1467377 | 10/2004 |
| GB | 2332766 | 6/1999 |
| WO | WO-2007078885 A2 | 7/2007 |
| WO | WO-2007078885 A3 | 7/2007 |

* cited by examiner ns capable of storing multiple bits of information each by being "programmed" to have different threshold voltages $V_T$. For example, each of transistors 112, 114, and 116 may be

MULTI-LEVEL MEMORY CELL SENSING

FIELD

The present invention relates generally to memory devices, and more specifically to memory devices with multi-level cells.

BACKGROUND

Memory devices store digital information. As technology advances, memory devices are able store increasingly large amounts of information. Historically, information density in memories has increased through reductions in device sizes and increases in integration. Information density may also be increased by storing more than one bit of information in each memory "cell."

DESCRIPTION OF EMBODIMENTS

Figure 1:
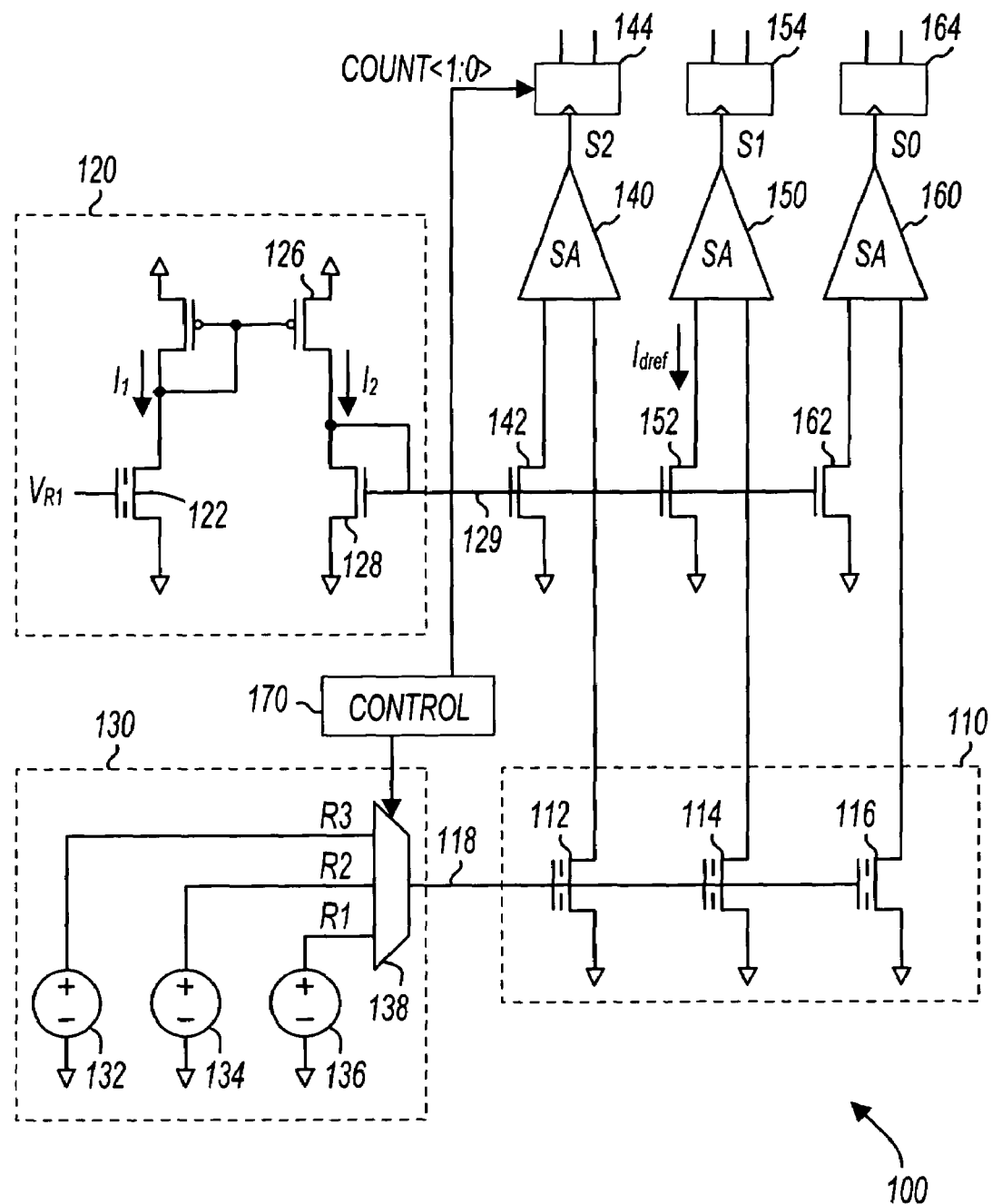
FIG. 1 shows a multi-level cell memory device.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a multi-level cell memory device. Memory device 100 includes memory array 110, reference current generator 120, stepped voltage generator 130, sense amplifiers 140, 150, and 160, current mirror transistors 142, 152, and 162, latches 144, 154, and 164, and control circuit 170.

Memory array 110 is shown including multi-level cell transistors 112, 114, and 116 having gate nodes coupled to wordline 118. Transistors 112, 114, and 116 are transistors capable of storing multiple bits of information each by being "programmed" to have different threshold voltages $V_T$. For example, each of transistors 112, 114, and 116 may be "FLASH" cells that have floating gates capable of storing charge. The threshold voltage of a programmed transistor depends in part on the amount of charge stored on the floating gate. By varying the amount of charged stored, transistors 112, 114, and 116 may be programmed to one of many different levels. For example, transistors 112, 114, and 116 may each be programmed to one of four levels to effectively store two bits of information in each memory cell. Although this description focuses on embodiments in which each multi-level cell is programmed to one of four levels, the various embodiments of the invention are not so limited. For example, in some embodiments of the present invention, each multi-level cell may be programmed to one of eight levels or one of 16 levels.

For simplicity, FIG. 1 shows one row of cells in the array 110. In some embodiments, the array includes many rows and columns of cells. Further, in some embodiments, arrays are arranged in blocks, and many blocks are included within memory device 100. Memory device 100 may be any size with any hierarchical arrangement without departing from the scope of the present invention.

In operation, the various embodiments of the present invention provide an accurate sensing scheme for the multi-level cells in array 110. The cell state is determined by performing multiple comparisons of the cell drain current to a fixed reference current where the cell gate voltage is varied for each comparison. For an N-state memory, N−1 comparisons with N−1 gate voltage values are used to uniquely determine the cell state.

Stepped voltage generator 130 sources the N−1 gate voltage values, where N is equal to 4. The N−1 gate voltage values are fixed and are generated using ideal on-chip voltage reference circuits 132, 134, and 136, which are independent of environmental conditions. A timing control circuit 170 generates control signals to control multiplexer 138. Multiplexer 138 selects one of the N−1 gate voltage values to be applied to the wordline. In some embodiments, the gate voltage sequences from high values to low values (step down). In other embodiments, the gate voltage sequences from low to high (step up). In still further embodiments, the sequence of gate voltages is arbitrary. For example, for a multi-level cell having four possible states, the gate may be driven with three voltage values in sequence starting with the center value, then proceeding to the low value, and then the high value.

Sense amplifiers 140, 150, and 160 are used to compare currents in array cells to the reference current. For example, sense amplifier 140 compares a drain current in transistor 112 to a drain current in transistor 142. The output of the sense amplifier is a digital signal representing the result of the comparison. This comparison result is converted to a binary representation of the cell state by logically combining the comparison result with a digital count that represents the cell state being compared against. Various methods can be used to perform this state determination. In some embodiments, one or several latches are coupled to each amplifier to latch the state value. An example embodiment is shown in FIG. 1 with latches 144, 154, and 164 receiving a "count" value from control circuit 170, and a clock signal from the associated sense amplifier. When the sense amplifier output changes state, the count value that represents the cell state is latched. As shown in FIG. 1, multiple sense amplifiers are included, where each sense amplifier is connected to a unique bitline. This allows many cells to be read simultaneously to increase the data throughput. All cells being read simultaneously receive a common gate voltage applied through the wordline.

For program and erase operations, it may be desirable to position the cell levels halfway between the state boundaries used for read. This provides high reliability for subsequent read operations. This state positioning may be accomplished by incorporating a special read mode, called verify mode, into the program and erase operations. This mode is used to verify that the cell state is correctly positioned. The verify mode gate voltage values are intentionally offset from the read mode voltages to achieve the desired state positioning. It may also be desirable for verify mode to use the same gate voltage timing and sequence as used during read mode so that transient offsets in the gate path will be common to both verify and read, thus being cancelled.

Reference current generator 120 includes reference cell 122, which in some embodiments, is identical to array cells. For example, reference cell 122 may be identical to cell transistors 112, 114, and 116. The threshold voltage values of reference cell 122 are adjusted during manufacturing or testing to achieve the desired nominal reference current. The gate voltage of the reference cell is ideal (independent of environment). In some embodiments, a separate reference current generator 120 is provided for each sense amplifier. In embodiments represented by FIG. 1, a current mirror is used to propagate the current of a single reference cell to each of the sense amplifiers. For example, the current in reference cell 122 ($I_1$) is mirrored to transistors 126 and 128 as $I_2$, which is in turn mirrored to transistors 142, 152, and 162 as $I_{dref}$. Transistor scaling techniques may be employed to provide fixed relationships between currents $I_1$, $I_2$, and $I_{dref}$.

In some embodiments, reference cell 122 is replaced by many cells whose current is averaged to generate a current of an average reference cell. Also in some embodiments, the mirror gate voltage on node 129 is sampled and held on a large capacitor allowing the reference current generator to be turned off most of the time. Examples of these embodiments are described below with reference to FIG. 3.

In embodiments having a temperature independent gate voltage on reference cell 122, the reference cell current is temperature-dependent due to the inherent temperature dependency of the cell. The reference current temperature dependency matches the temperature dependency of the main array cell which is also receiving a temperature independent gate voltage. This temperature tracking behavior ensures that the state difference obtained during verify is preserved during read, even if the temperature changes between verify and read operations.

Figure 2:
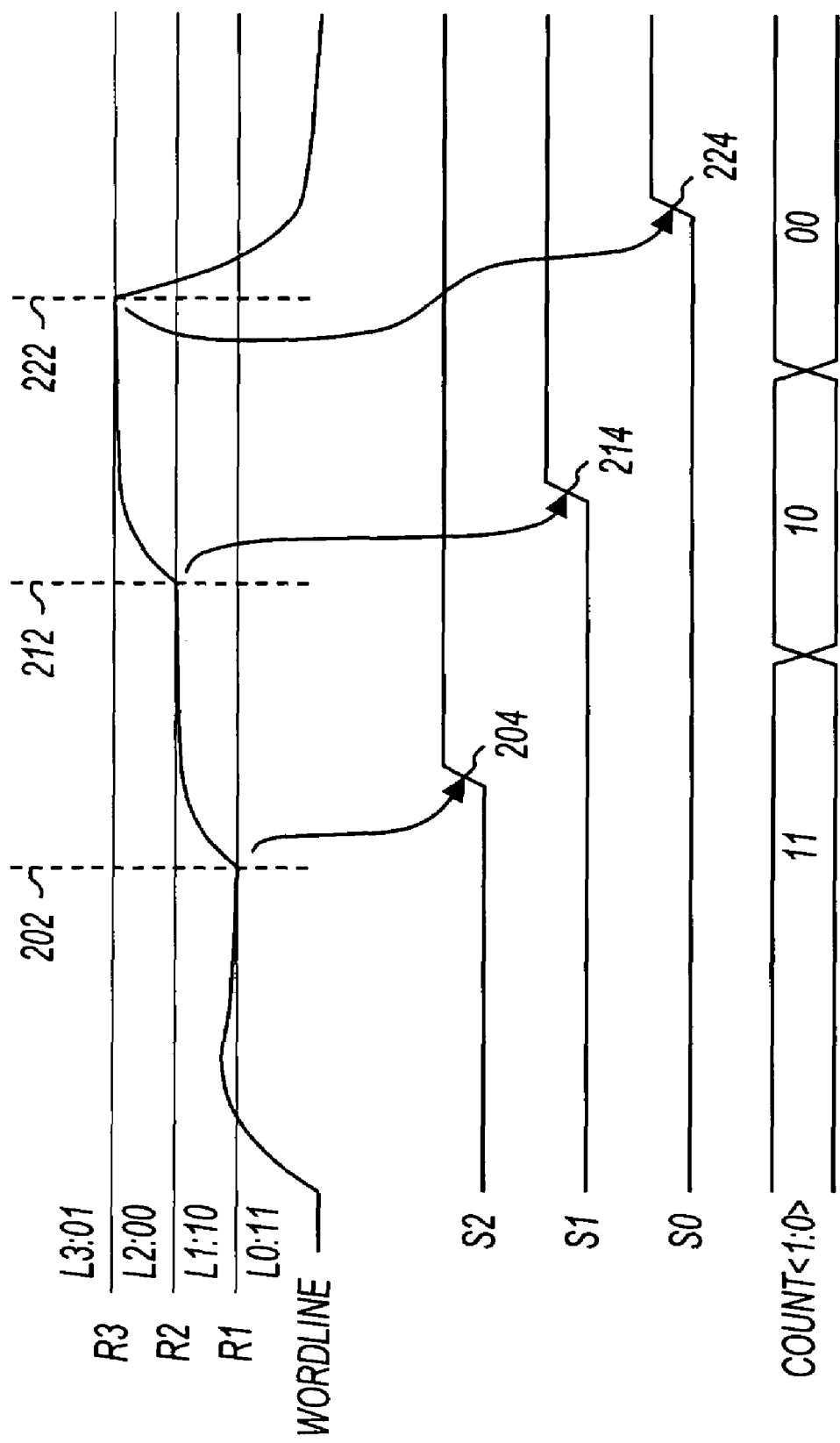
FIG. 2 shows waveforms corresponding to a read cycle of the memory device of FIG. 1.

FIG. 2 shows waveforms corresponding to a read cycle of the memory device of FIG. 1. The four levels L0, L1, L2, L3 represent the four possible states of the memory cell. The outputs S0, S1, S2, of the sense amplifiers are placed at a known state at the beginning of the sense operation. In embodiments represented by FIG. 2, the gate voltage of the memory cell (the wordline voltage) steps up through different cell levels to reference voltage values shown as R1, R2, and R3. As the wordline voltage ramps up, the state of the sense amplifier output changes at a point based on the $V_T$ of the flash cell. The point at which the sense amplifier output changes state is referred to as the "sense amplifier trip point." The gate voltage steps are synchronized with a counter, which counts the different data output states. As soon as the sense amplifier output changes state after sensing, the counter signal value is latched and determines the level of the flash cell.

In the example provided in FIG. 2, memory cell transistor 112 (FIG. 1) has a programmed $V_T$ in the L0 state, memory cell transistor 114 has a $V_T$ programmed in the L1 state, and memory cell transistor 116 has a $V_T$ programmed in the L2 state. As the wordline voltage is stepped up, each sense amplifier trips accordingly. For example, S2 trips at 204 as a result of the sense operation performed at 202, S1 trips at 214 as a result of the sense operation performed at 212, and S0 trips at 224 as a result of the sense operation at 222. S2, S1, and S0 are used to latch the count value, so latch 144 stores a logic level of "11," latch 154 stores a logic level of "10," and latch 164 stores a logic level of "00." Any latches coupled to sense amplifiers that do not trip remain at their initialized state of "01," corresponding to the last level L3.

In some embodiments, the sense amplifiers sample the differential inputs at points 202, 212, and 222. After the bitlines are sampled, the wordline can start changing to the next level. With the sense amplifiers isolated from the memory cells, the sensing operation can complete in parallel with the wordline change for the next step. This background sensing while the wordline is ramping up may improve speed and performance.

Figure 3:
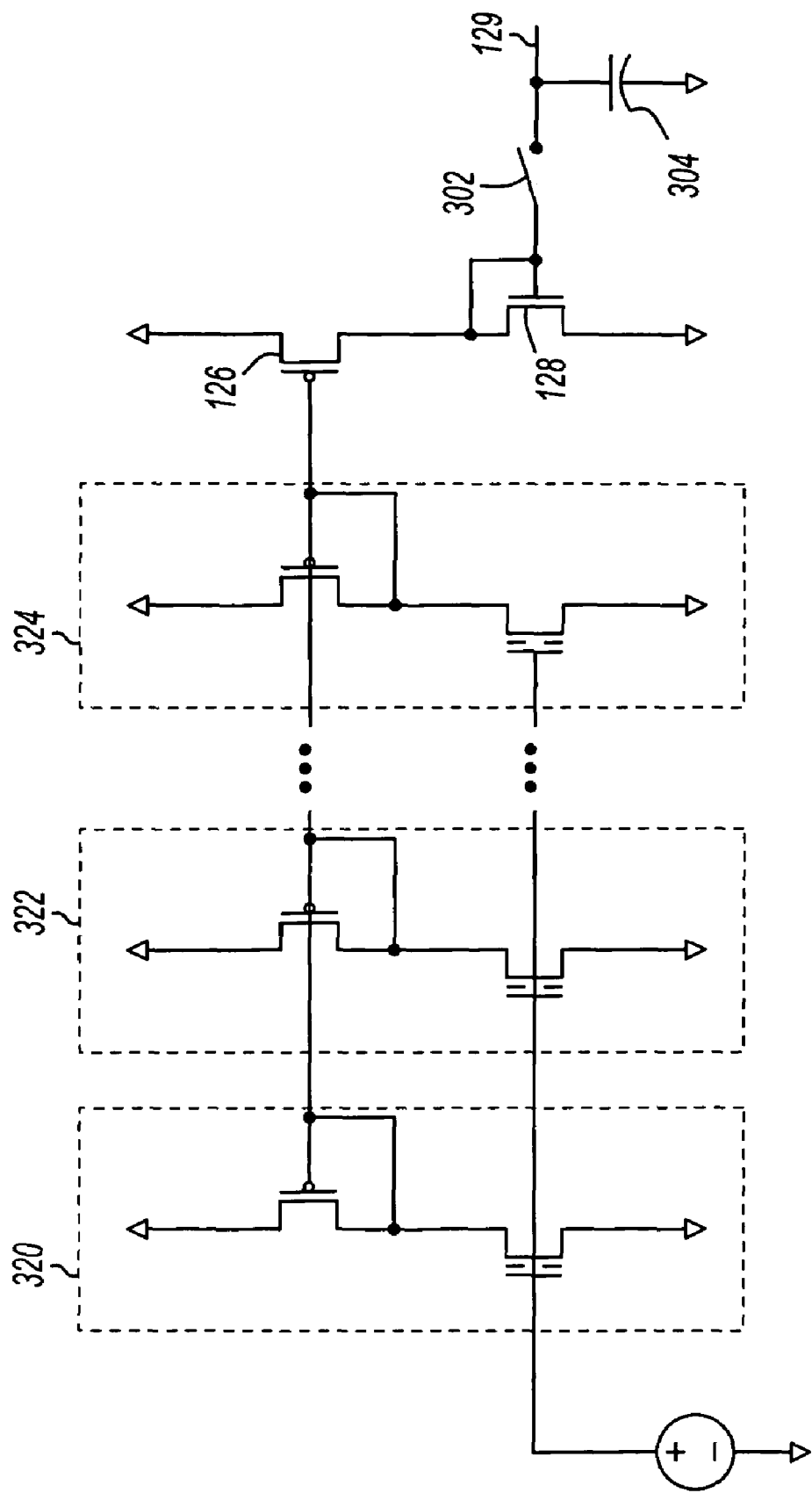
FIG. 3 shows a current mirror having reference current averaging.

FIG. 3 shows a current mirror having reference current averaging. In some embodiments, the circuitry shown in FIG. 3 is used for the reference current generator 120 (FIG. 1). The current mirror of FIG. 3 includes a plurality of current reference circuits. For example, current reference circuits 320, 322, and 324 are coupled in parallel to average the individual reference currents. Each of the FLASH cells shown in FIG. 3 may be individually trimmed using programming circuitry (not shown). Transistors 126 and 128 are the same as those shown in FIG. 1. The circuit in FIG. 3 also includes a switch 302 and capacitor 304. The switch and capacitor may be used to sample and hold the voltage value on node 129, which is provided to the mirror transistors at each sense amplifier. By sampling and holding this voltage, much of the remaining current mirror circuitry may be turned off to save power.

Figure 4:
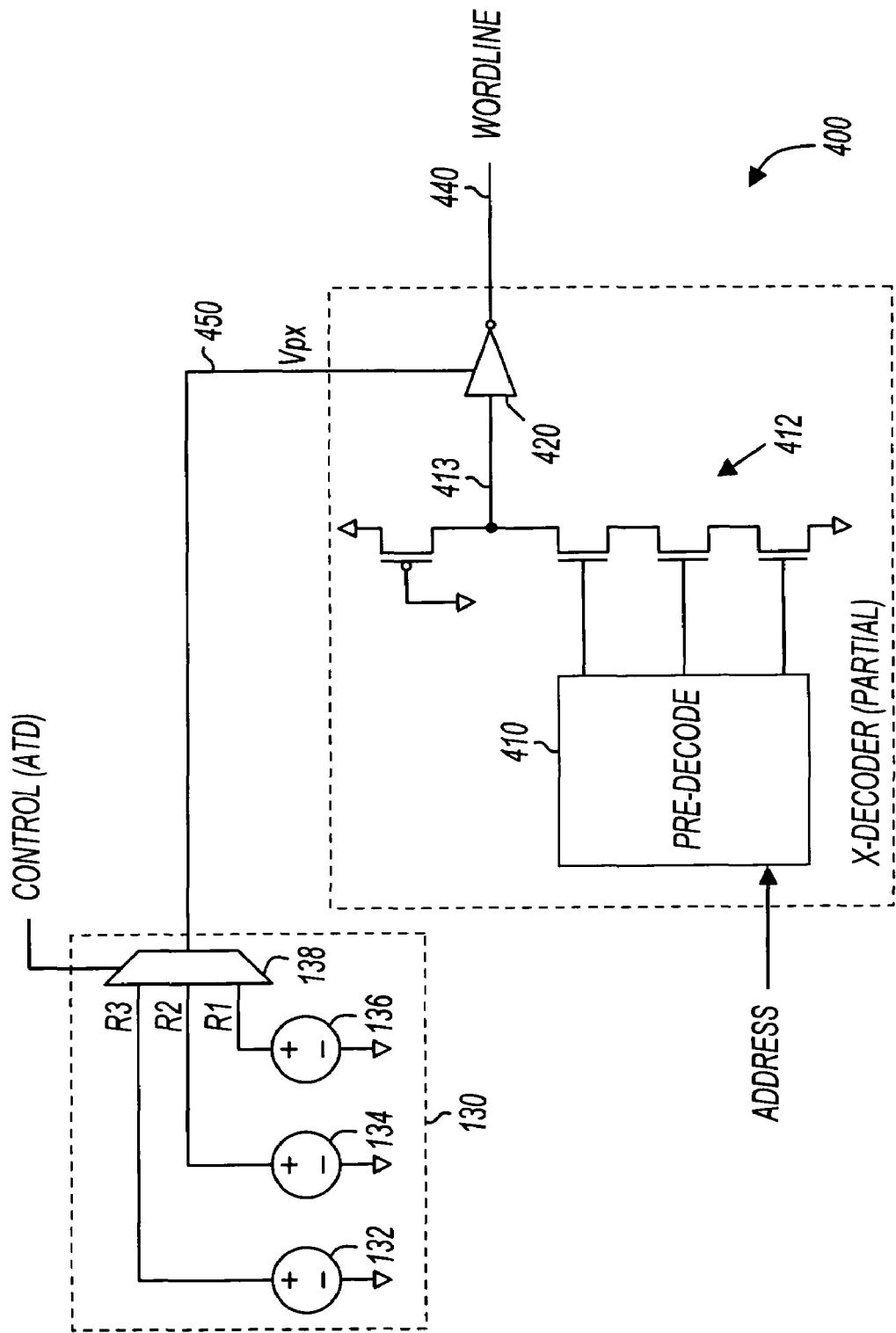
FIG. 4 shows a portion of an x-decoder coupled between a stepped voltage generator and a wordline.

FIG. 4 shows a portion of an x-decoder coupled between a stepped voltage generator and a wordline. X-decoder 400 decodes a portion of the address provided to the memory device, and selects a wordline. FIG. 4 shows a single wordline, but in some embodiments, x-decoder 400 can select one of many wordlines. Pre-decoder 410 receives address signals and drives signals at the input to NAND gate 412. When wordline 440 is to be selected, NAND gate 412 drives a low voltage on node 413 which drives output buffer 420. Output buffer 420 receives a voltage Vpx on a power supply node. Accordingly, when wordline 440 is selected, the power supply node voltage Vpx is driven onto wordline 440.

Figure 5:
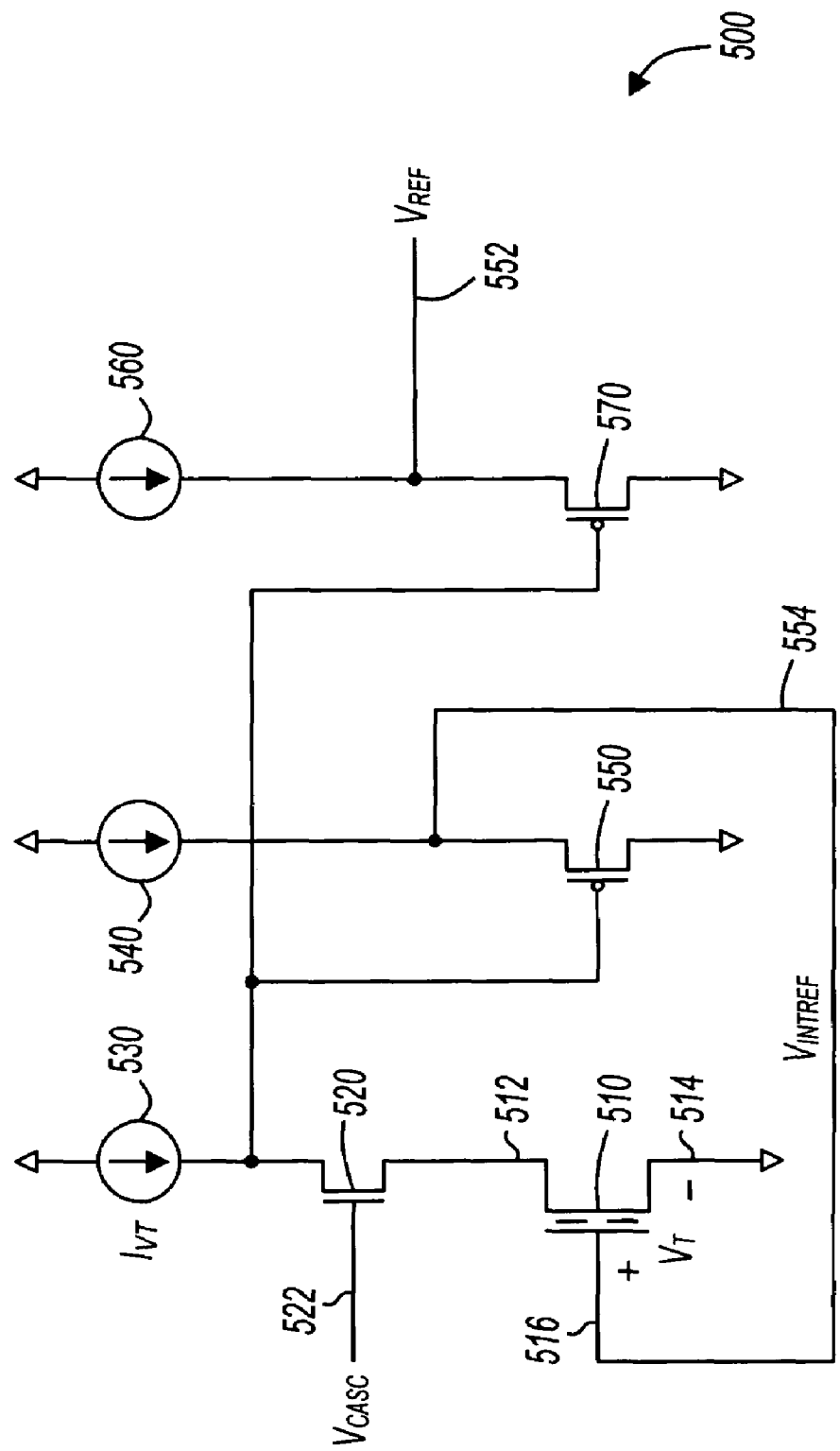
FIGS. 5 and 6 show voltage reference circuits.
Figure 6:
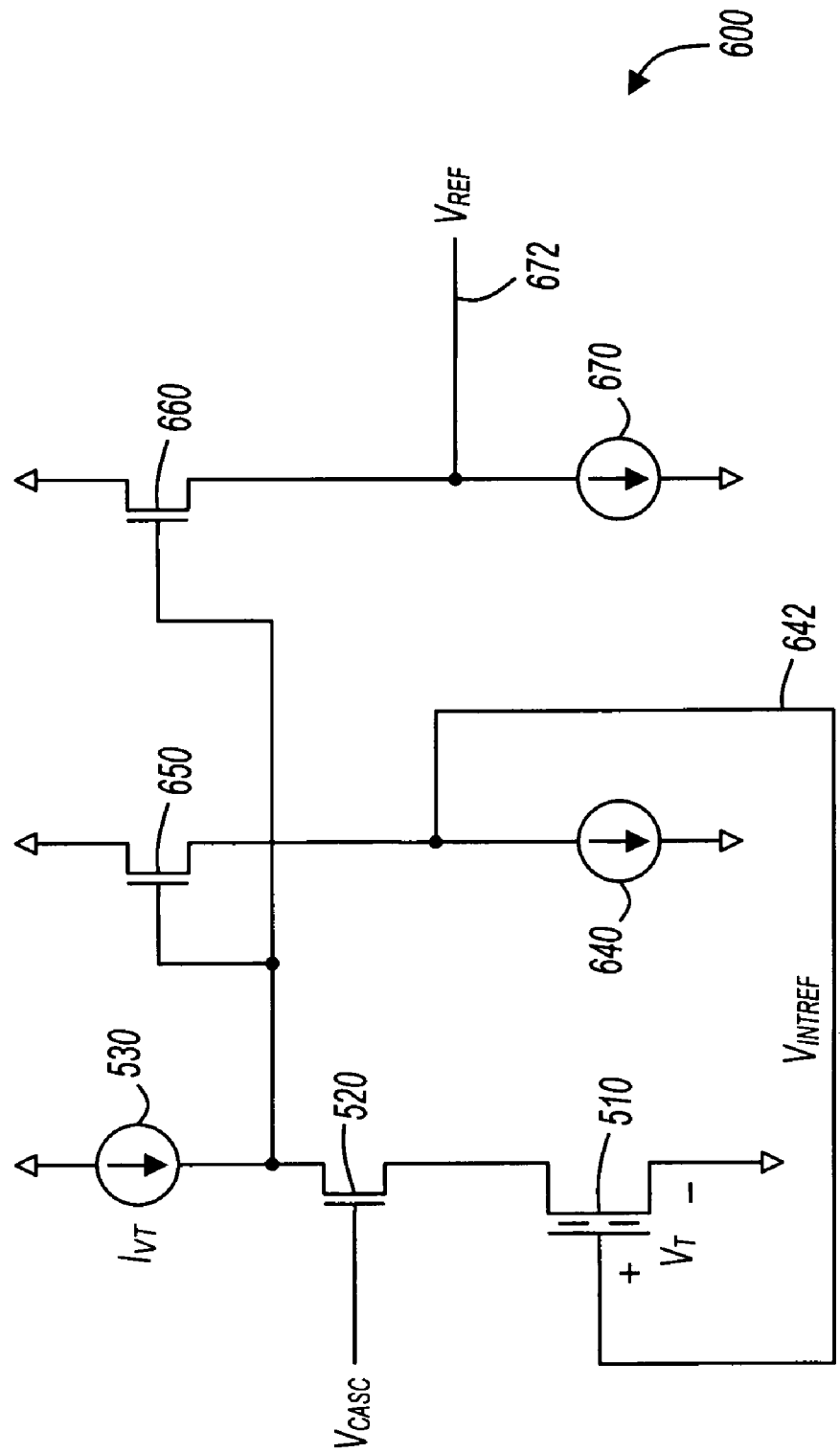

The voltage step up waveform is supplied as Vpx by stepped voltage generator 130. Referring now back to FIG. 1, wordline 118 is shown being driven directly by stepped voltage generator 130. FIG. 4 provides an example embodiment that shows how a wordline can be selected to be coupled to the stepped voltage generator. Voltage reference circuits 132, 134, and 136 may be implemented in many different ways. FIGS. 5 and 6, discussed below, show examples of suitable voltage reference circuits.

FIG. 5 shows a voltage reference circuit. Voltage reference circuit 500 may be utilized within a stepped voltage generator used to source a wordline voltage. For example, voltage reference circuit 500 may be included in stepped voltage generator 130 (FIGS. 1,4). Further, additional instantiations of voltage reference circuit 500 may be included in stepped voltage generator 130. In some embodiments, voltage reference circuit 500 is utilized as voltage reference circuit 136 to produce reference voltage level R1.

Voltage reference circuit 500 includes flash cell 510, transistors 520, 550, and 570, and current sources 530, 540, and 560. Flash cell 510, transistor 520, and current source 530 form a first stage; transistor 550 and current source 540 form a second stage; and current source 560 and transistor 570 form an output stage. The second stage is coupled to the first stage as part of a feedback loop in a unity gain configuration, and the output stage is coupled to provide an open loop output response.

Flash cell 510 is an example of a floating gate transistor having a variable threshold voltage ($V_T$). The threshold voltage of flash cell 510 may be modified by changing the amount of charge stored on the floating gate of flash cell 510. This may also be referred to as "programming" flash cell 510. Flash cell 510 may be programmed with programming circuitry (not shown) useful for programming floating gate transistors.

As used herein, the term "threshold voltage current" refers to the current that flows through a transistor when a voltage of substantially $V_T$ appears across the control terminals of the transistor, and the drain voltage is set to a nominal value. For example, the threshold voltage current of an NMOS transistor is equal to the drain-to-source current of the transistor when the gate-to-source voltage is substantially $V_T$. Also for example, the threshold voltage current ($I_{VT}$) of flash cell 510 flows from drain 512 to source 514 when the gate-to-source voltage between nodes 516 and 514 is substantially $V_T$.

Transistor 520 is coupled between current source 530 and flash cell 510 in a cascode configuration. The gate node of transistor 520 is coupled to node 522 which has a voltage of $V_{CASC}$. $V_{CASC}$ is a voltage that is chosen to provide a suitable drain voltage on drain node 512 of flash cell 510. For example, in some embodiments, $V_{CASC}$ is chosen to provide a drain voltage of between about 0.7 volts and 1.2 volts. In some embodiments, $V_{CASC}$ is set once and is static thereafter. For example, $V_{CASC}$ may be provided by an on-chip voltage reference that remains static. In other embodiments, $V_{CASC}$ may be provided by a variable voltage reference circuit, so that the drain voltage on flash cell 510 may be modified.

The gate node of transistor 550 is coupled to the drain node of transistor 520 to receive a voltage that is influenced by flash cell 510. The drain node of transistor 550 is coupled to a power supply node (which may be "ground"), and the source node of transistor 550 is coupled to provide the feedback voltage $V_{INTREF}$ on node 554. In some embodiments, transistor 550 is operated in the sub-threshold region where the transconductance ($g_m$) of the transistor is proportional to the drain current. This operation is in contrast to operation in the inversion saturation region where $g_m$ is proportional to the square-root of the drain current. In other words, in the sub-threshold region of operation, the value of $g_m$ is higher for a given drain current. The output impedance of the source follower stage is equal to $1/g_m$ of transistor 550, and may be adjusted by choosing the size of source follower transistor 550 and the drain current provided by current source 540.

Current source 530 provides a current $I_{VT}$ substantially equal to the threshold voltage current of flash cell 510. The operation of the feedback loop in combination with current sourced by current source 530 forces the gate-to-source voltage of flash cell 510 to be substantially $V_T$, which may vary based on how flash cell 510 has been programmed. The output voltage $V_{REF}$ is provided by the voltage on gate node 516, which is substantially equal to $V_T$. By programming flash cell 510 to have a different $V_T$, $V_{REF}$ may be modified.

Transistor 570 is a P-channel transistor coupled as a source-follower. P-channel source-followers may be advantageously used to pull down the output node much faster when the initial voltage is higher than the nominal voltage. With the gate voltage fixed, the initial source-to-gate voltage of the source follower transistor will be higher than its nominal value and it can pull down the output voltage very strongly to the nominal value.

In some embodiments, current sources 540 and 560 are designed to source the same current value. Also in some embodiments, transistors 550 and 570 are matched devices that exhibit substantially the same operating characteristics. In embodiments represented by FIG. 5, transistors 550 and 570 are driven by a common gate voltage. In these embodiments, if transistors 550 and 570 are matched, and the two load currents provided by current sources 540 and 560 are matched, the output voltage $V_{REF}$ will be substantially equal to internal loop voltage $V_{INTREF}$ on node 554, which is in turn substantially equal to the threshold voltage $V_T$ of flash cell 510. With the gate voltage of transistor 570 held fixed by the closed loop configuration, transistor 570 may respond very fast and may be able to pull down any voltage on output node 552 to the $V_{REF}$ voltage value without disrupting the operation of the feedback loop.

FIG. 6 shows a voltage reference circuit. Voltage reference circuit 600 may be utilized within a stepped voltage generator. For example, voltage reference circuit 600 may be included in stepped voltage generator 130 (FIGS. 1,4). Further, additional instantiations of voltage reference circuit 600 may be included in stepped voltage generator 130. In some embodiments, voltage reference circuit 600 is used to implement voltage reference circuits 134 and 132 to generate reference voltages R2 and R3.

Voltage reference circuit 600 includes flash cell 510, transistor 520, and current source 530, which are all described above with reference to FIG. 5. As described above, flash cell 510, transistor 520, and current source 530 together form an amplifier stage. Voltage reference circuit 600 also includes transistor 650 coupled in a source follower arrangement with current source 640 providing a drain-to-source current for transistor 650. The source follower circuit of transistor 650 and current source 640 are coupled to the first amplifier stage in a unity gain feedback configuration. In some embodiments, source follower transistor 650 is operated in the sub-threshold region.

The operation of voltage reference circuit 600 is similar to the operation of voltage reference circuit 500 (FIG. 5) except that transistors 650 and 660 of the source follower circuits are n-channel devices rather than p-channel devices. N-channel source-followers may be advantageously used to pull up the output node when the initial voltage is lower than the nominal voltage. With the gate voltage fixed, the initial gate-to-source voltage of the source follower transistor will be higher than its nominal value and it can pull up the output voltage very strongly to the nominal value.

Figure 7:
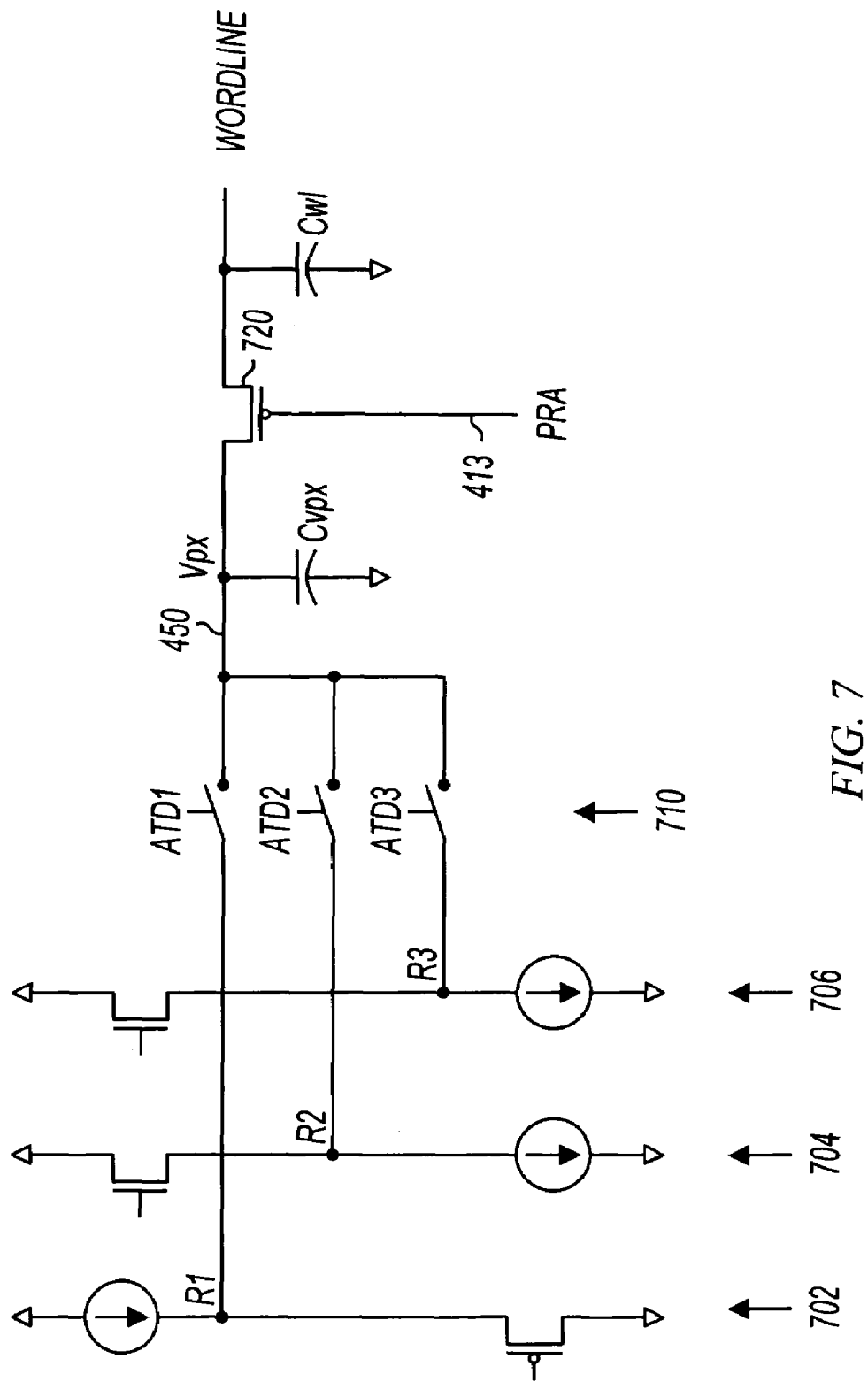
FIG. 7 shows voltage reference circuits coupled to a wordline.

FIG. 7 shows voltage reference circuits coupled to a wordline. Circuits 702, 704, and 706 represent output circuits of voltage reference circuits such as voltage reference circuits 500 and 600 (FIGS. 5,6). Switches 710 correspond to multiplexer 138, and selectively couple the voltage reference circuits to node 450. Node 450 is an intermediate node that functions as the power supply node for the x-decoder output buffer shown in FIG. 4. Transistor 720 is a pass transistor that represents the upper transistor in output buffer 420. When the PRA signal on node 413 is low, the wordline is selected and is coupled to node 450.

Voltage reference circuit output stage 702 includes a p-channel transistor to efficiently pull down the voltage on node 450 quickly, and voltage reference circuit output stages 704 and 706 include n-channel transistors to efficiently pull up the voltage on node 450 quickly.

A stepped voltage waveform may be produced on the wordline by controlling switches 710 and transistor 720. Signals ATD<1:3> may be closed in sequence to provide a stepped voltage waveform on node 450, and when transistor 720 is turned on, the voltage on node 450 is coupled to the wordline. The operation of the circuits shown in FIG. 7 is described with reference to FIGS. 8 and 9.

Figure 8:
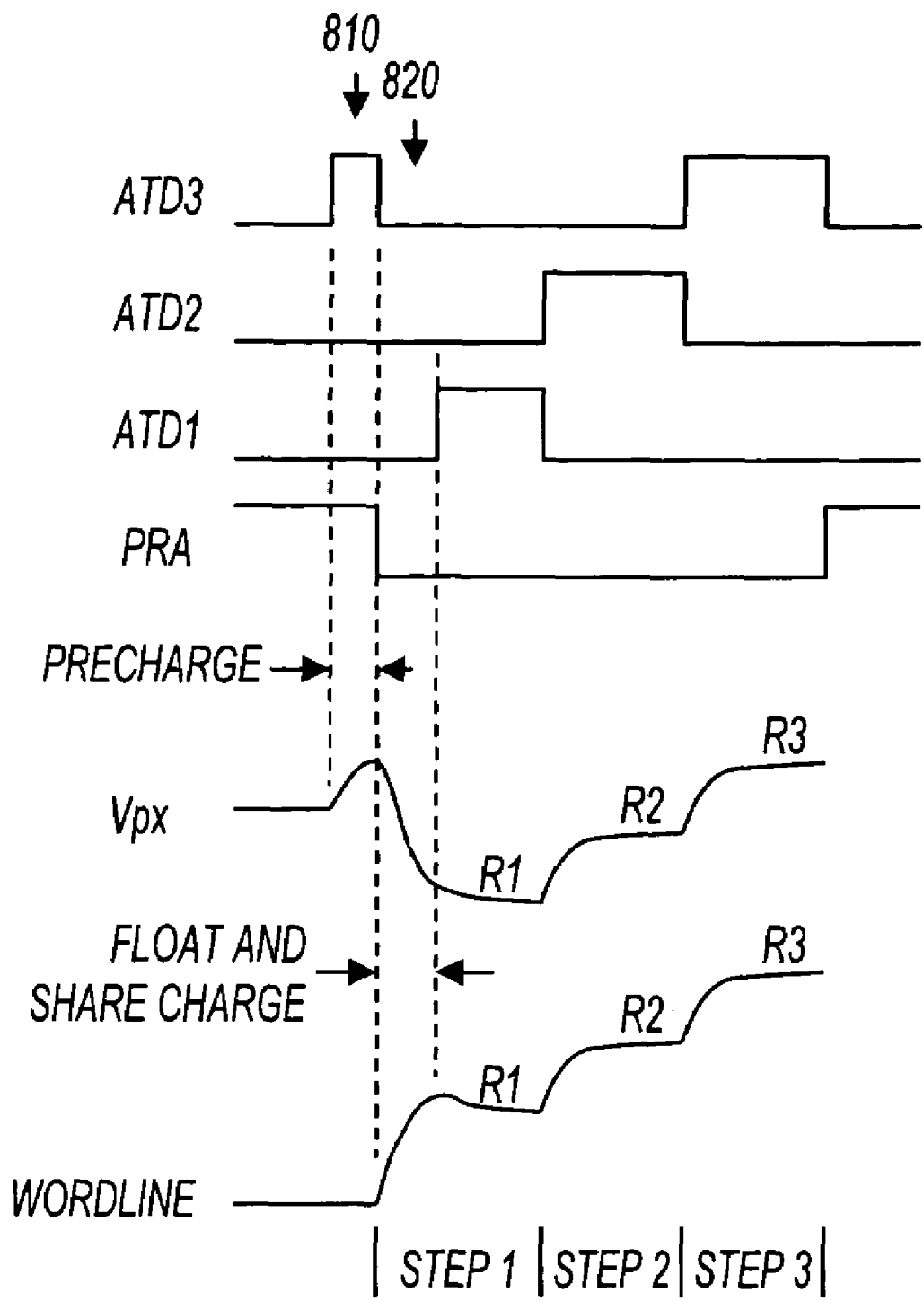
FIG. 8 shows waveforms corresponding to the operation of the circuits of FIG. 7.

FIG. 8 shows waveforms corresponding to the operation of the circuits of FIG. 7. As shown in FIG. 8, Vpx on node 450 steps up in voltage from R1, to R2, and to R3. During Step 1, Vpx (and the wordline) settle to R1; during Step 2, they settle to R2; and during Step 3, they settle to R3. At or near each step, sensing of multi-level cells can occur as described with respect to previous figures.

FIG. 8 also shows Vpx being pre-charged to R3 prior to being coupled to the wordline. At 810, ATD3 is asserted to pre-charge Vpx, and at 820, node 450 is allowed to electrically float by opening switches 710. Also at 820, node 450 is coupled to the wordline to allow charge sharing between the capacitance on node 450 (Cvpx) and the capacitance on the wordline (Cwl). As a result of the charge sharing, the wordline is pulled up in voltage as the pre-charged Vpx drops in voltage.

In some embodiments, the voltage levels, capacitance values, and timing are adjusted to allow the wordline to approach R1 from a higher voltage. For example, as shown in FIG. 8, the charge sharing operation at 820 brings the wordline voltage above R1 prior to ATD1 being asserted. When ATD1 is asserted, the voltage reference circuit that sources R1 will pull the wordline down to R1 from a higher voltage rather than pulling the wordline up to R1 from a lower voltage.

In some embodiments, the voltage reference circuit that sources R1 has an output stage similar to output stage 702 (FIG. 7). Output stage 702 is efficient at pulling down, in part because the p-channel transistor is coupled to sink current to a lower potential.

During Step 2, ATD2 is asserted to source R2 onto the wordline, and during Step 3, ATD3 is asserted to source R3 onto the wordline. In some embodiments, the voltage reference circuits that source R2 and R3 have output stages similar to output stages 704 and 706 (FIG. 7). Output stages 704 and 706 are efficient at pulling up, in part because the n-channel transistor is coupled to source current from a higher potential.

Figure 9:
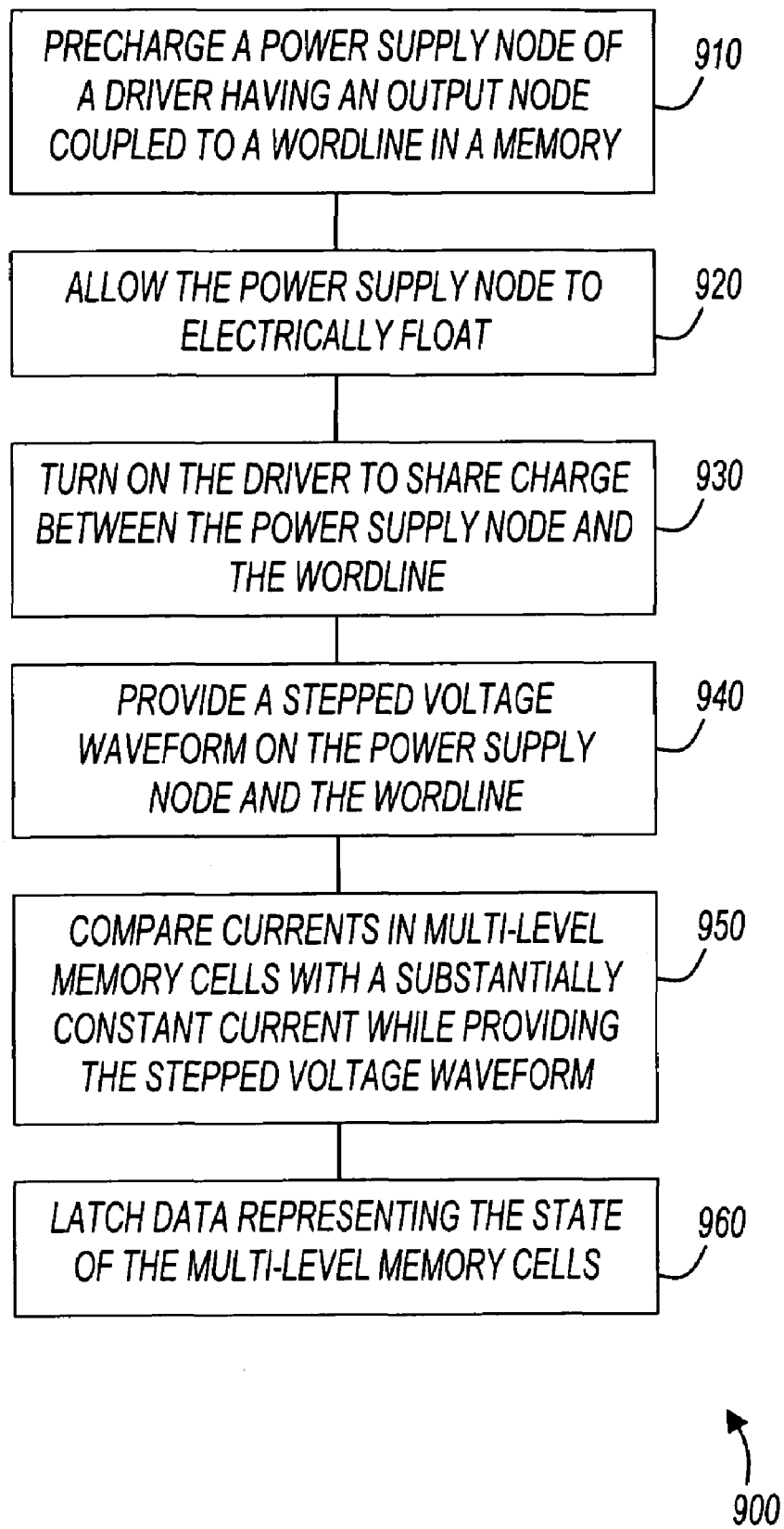
FIG. 9 shows a flowchart in accordance with various embodiments of the present invention.

FIG. 9 shows a flowchart in accordance with various embodiments of the present invention. In some embodiments, method 900, or portions thereof, is performed by a memory device. In other embodiments, method 900 is performed by a control circuit, an integrated circuit, or an electronic system. Method 900 is not limited by the particular type of apparatus or software performing the method. The various actions in method 900 may be performed in the order presented, or may be performed in a different order. Further, in some embodiments, some actions listed in FIG. 9 are omitted from method 900.

Method 900 is shown beginning with block 910 in which a power supply node of a driver having an output node coupled to a wordline in a memory is pre-charged. In some embodiments, this corresponds to an x-decoder power supply node being pre-charged. For example, as shown in FIG. 4, an x-decoder may have multiple power supply nodes, where at least one is used to provide a power supply voltage to an output buffer coupled to a wordline. The power supply node may be pre-charged to a voltage value corresponding to a wordline voltage used for a read operation, or the power supply node may be pre-charged to a different voltage.

At 920, the power supply node is allowed to electrically float. In some embodiments, this corresponds to decoupling the power supply node from any circuit used for the pre-charge operation of 910. At 930, the driver is turned on to share charge between the power supply node and the wordline. For example, referring back to FIG. 4, driver 420 may be "turned on" by asserting the input signal on node 413, which corresponds to selecting the wordline. By "turning on" the driver, the wordline is coupled to the driver's power supply node which is electrically floating. As shown in FIG. 7, transistor 720 turns on when the driver is turned on, and this provides the charge sharing path between Vpx and the wordline. At this point, the wordline and the power supply node share charge, and the voltage on the wordline increases as shown in FIG. 8.

At 940, a stepped voltage waveform is provided on the power supply node and on a selected wordline. The wordline is selected by the decoder, and the power supply voltage on the output buffer provides the stepped voltage waveform to the wordline.

At 950, currents in multi-level cells are compared with a substantially constant current while providing the stepped voltage waveform. At 960, data representing the state of the multi-level cells is latched. Referring now back to FIG. 1, wordline 118 receives a stepped voltage waveform, and drain currents in the multi-level cells 112, 114, and 116 depend on the programmed $V_T$ of the memory cell transistors. These drain currents are compared against substantially constant currents provided by mirror transistors 142, 152, and 162, and sense amplifiers 140, 150, and 160 make the comparison. Latches 144, 154, and 164 latch the state of the memory cells in response to the sense amplifier operation.

Figure 10:
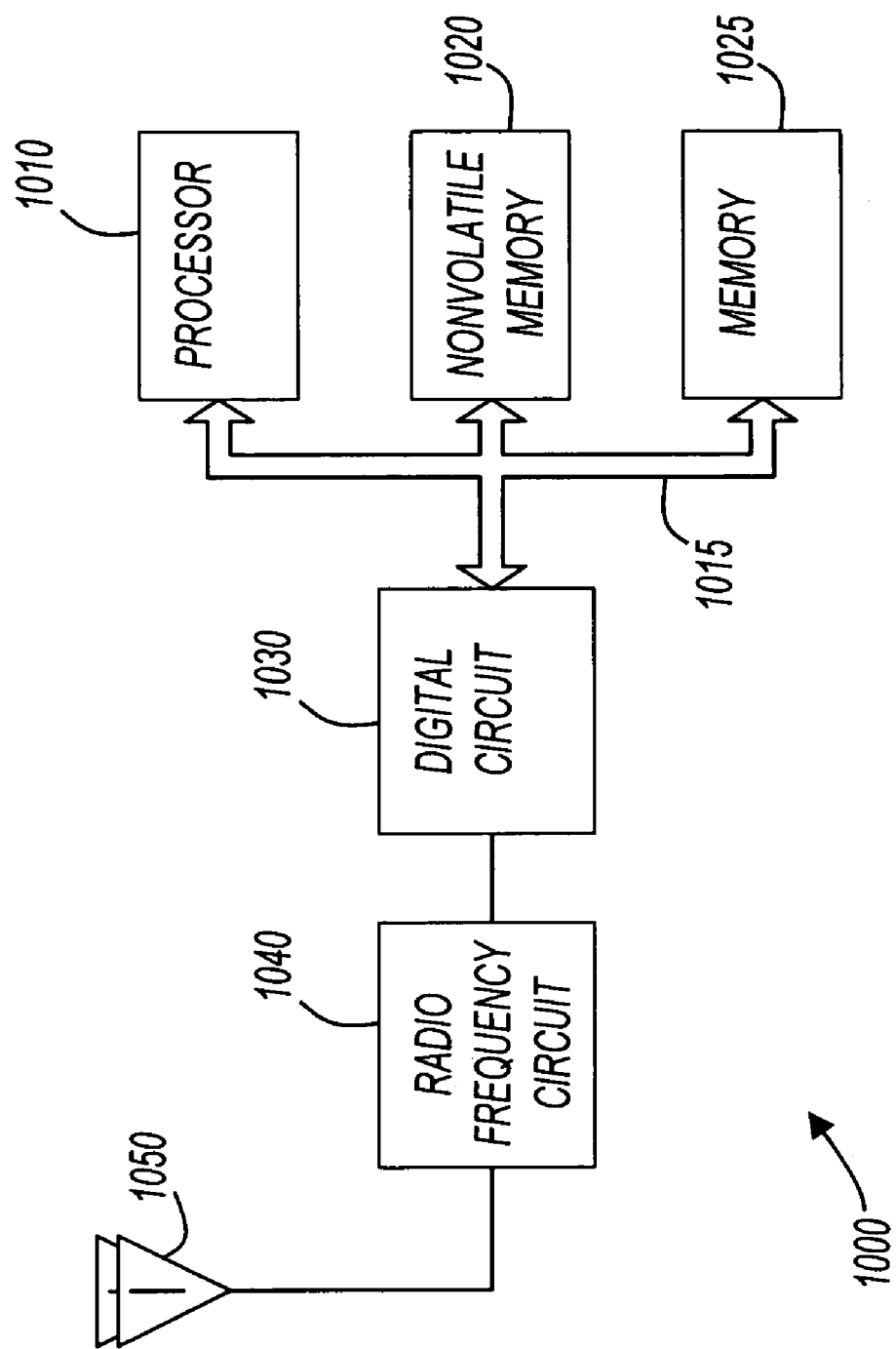
FIG. 10 shows an electronic system in accordance with various embodiments of the present invention.

FIG. 10 shows an electronic system in accordance with various embodiments of the present invention. Electronic system 1000 includes processor 1010, nonvolatile memory 1020, memory 1025, digital circuit 1030, radio frequency (RF) circuit 1040, and antennas 1050. Processor 1010 may be any type of processor adapted to access nonvolatile memory 1020 and memory 1025. For example, processor 1010 may be a microprocessor, a digital signal processor, a microcontroller, or the like.

Example systems represented by FIG. 10 include cellular phones, personal digital assistants, wireless local area network interfaces, or any other suitable system. Nonvolatile memory 1020 may be adapted to hold information for system 1000. For example, nonvolatile memory 1020 may hold device configuration data, such as contact information with phone numbers, or settings for digital circuit 1030 or RF circuit 1040. Further, nonvolatile memory 1020 may hold multimedia files such as photographs or music files. Still further, nonvolatile memory 1020 may hold program code to be executed by processor 1010. Nonvolatile memory 1020 may be any of the memory embodiments described herein, including memory device 100 (FIG. 1). Many other systems uses for nonvolatile memory 1020 exist. For example, nonvolatile memory 1020 may be used in a desktop computer, a network bridge or router, or any other system without an antenna.

Radio frequency circuit 1040 communicates with antennas 1050 and digital circuit 1030. In some embodiments, RF circuit 1040 includes a physical interface (PHY) corresponding to a communications protocol. For example, RF circuit 1040 may include modulators, demodulators, mixers, frequency synthesizers, low noise amplifiers, power amplifiers, and the like. In some embodiments, RF circuit 1040 may include a heterodyne receiver, and in other embodiments, RF circuit 1040 may include a direct conversion receiver. In some embodiments, RF circuit 1040 may include multiple receivers. For example, in embodiments with multiple antennas 1050, each antenna may be coupled to a corresponding receiver. In operation, RF circuit 1040 receives communications signals from antennas 1050, and provides signals to digital circuit 1030. Further, digital circuit 1030 may provide signals to RF circuit 1040, which operates on the signals and then transmits them to antennas 1050.

Digital circuit 1030 is coupled to communicate with processor 1010 and RF circuit 1040. In some embodiments, digital circuit 1030 includes circuitry to perform error detection/correction, interleaving, coding/decoding, or the like. Also in some embodiments, digital circuit 1030 may implement all or a portion of a media access control (MAC) layer of a communications protocol. In some embodiments, a MAC layer implementation may be distributed between processor 1010 and digital circuit 1030.

Radio frequency circuit 1040 may be adapted to receive and demodulate signals of various formats and at various frequencies. For example, RF circuit 1040 may be adapted to receive time domain multiple access (TDMA) signals, code domain multiple access (CDMA) signals, global system for mobile communications (GSM) signals, orthogonal frequency division multiplexing (OFDM) signals, multiple-input-multiple-output (MIMO) signals, spatial-division multiple access (SDMA) signals, or any other type of communications signals. The present invention is not limited in this regard.

Antennas 1050 may include one or more antennas. For example, antennas 1050 may include a single directional antenna or an omni-directional antenna. As used herein, the term omni-directional antenna refers to any antenna having a substantially uniform pattern in at least one plane. For example, in some embodiments, antennas 1050 may include a single omni-directional antenna such as a dipole antenna, or a quarter wave antenna. Also for example, in some embodiments, antennas 1050 may include a single directional antenna such as a parabolic dish antenna or a Yagi antenna. In still further embodiments, antennas 1050 may include multiple physical antennas. For example, in some embodiments, multiple antennas are utilized to support multiple-input-multiple-output (MIMO) processing or spatial-division multiple access (SDMA) processing.

Memory 1025 represents an article that includes a machine readable medium. For example, memory 1025 represents a random access memory (RAM), dynamic random access memory (DRAM), static random access memory (SRAM), read only memory (ROM), flash memory, or any other type of article that includes a medium readable by processor 1010. Memory 1025 may store instructions for performing the execution of the various method embodiments of the present invention.

In operation, processor 1010 reads instructions and data from either or both of nonvolatile memory 1020 and memory 1025 and performs actions in response thereto. For example, processor 1010 may access instructions from memory 1025 and program threshold voltages within reference voltage generators and reference current generators inside nonvolatile memory 1020. In some embodiments, nonvolatile memory 1020 and memory 1025 are combined into a single memory device. For example, nonvolatile memory 1020 and memory 1025 may both be included in a single nonvolatile memory device.

Although the various elements of system 1000 are shown separate in FIG. 10, embodiments exist that combine the circuitry of processor 1010, nonvolatile memory 1020, memory 1025 and digital circuit 1030 in a single integrated circuit. For example, memory 1025 or nonvolatile memory 1020 may be an internal memory within processor 1010 or may be a microprogram control store within processor 1010. In some embodiments, the various elements of system 1000 may be separately packaged and mounted on a common circuit board. In other embodiments, the various elements are separate integrated circuit dice packaged together, such as in a multi-chip module, and in still further embodiments, various elements are on the same integrated circuit die.

The type of interconnection between processor 1010 and nonvolatile memory 1020 is not a limitation of the present invention. For example, bus 1015 may be a serial interface, a test interface, a parallel interface, or any other type of interface capable of transferring command and status information between processor 1010, nonvolatile memory 1020, and memory 1025.

Step voltage generators, voltage references, flash cells, feedback circuits, x-decoders, control circuits, and other embodiments of the present invention can be implemented in many ways. In some embodiments, they are implemented in integrated circuits. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, memory array 110 (FIG. 1) can be represented as polygons assigned to layers of an integrated circuit.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A memory circuit comprising:
  a plurality of memory cell transistors having programmable threshold voltages, each of the plurality of memory cell transistors having a gate node and a drain node;
  a wordline coupled to gate nodes of the plurality of memory cell transistors;
  a circuit to apply a sequence of voltages on the wordline during a read cycle of the plurality of memory cells, wherein voltages in the sequence of voltages are between the programmable threshold voltages;
  a plurality of sense amplifiers, wherein each sense amplifier is coupled to a corresponding drain node of the plurality of memory cell transistors;
  a current mirror circuit coupled to each of the plurality of sense amplifiers to provide a substantially constant current to be compared against currents flowing in the drain nodes of the memory cell transistors during the read cycle;
  a plurality of latches coupled to store data when output nodes of the plurality of sense amplifiers change state; and
  a control circuit to control the application of the sequence of voltages on the wordline, and to provide data to the plurality of latches.

2. The memory circuit of claim 1 wherein the current mirror circuit comprises a plurality current reference circuits coupled in parallel.

3. The memory circuit of claim 2 wherein each of the plurality of current reference circuits include a transistor having a programmable threshold voltage.

4. The memory circuit of claim 1 further comprising a sample and hold circuit coupled between the current mirror circuit and the plurality of sense amplifiers.

5. The memory circuit of claim 1 further comprising an x-decoder having output circuits coupled to receive the sequence of voltages on a power supply node.

6. The memory circuit of claim 5 wherein the power supply node is coupled to electrically float prior to providing the sequence of voltages.

7. The memory circuit of claim 5 wherein the control circuit is coupled to cause the power supply node to precharge and then to electrically float prior to providing the sequence of voltages.

* * * * *